(12) United States Patent
Krivokapic

(10) Patent No.: US 6,294,412 B1
(45) Date of Patent: Sep. 25, 2001

(54) SILICON BASED LATERAL TUNNELING MEMORY CELL

(75) Inventor: Zoran Krivokapic, Santa Clara, CA (US)

(73) Assignee: Advanced Micro Devices, Sunnyvale, CA (US)

(*) Notice: Subject to any disclaimer, the term of this patent is extended or adjusted under 35 U.S.C. 154(b) by 0 days.

(21) Appl. No.: 09/591,382

(22) Filed: Jun. 9, 2000

(51) Int. Cl.[7] ............... H01L 21/00; H01L 21/84; H01L 21/8234
(52) U.S. Cl. ............... 438/155; 438/237; 438/979
(58) Field of Search .................. 438/151, 149, 438/152, 155, 979, 962, 237

(56) References Cited

U.S. PATENT DOCUMENTS

| | | | |
|---|---|---|---|
| 5,032,891 | * 7/1991 | Takagi et al. | 357/41 |
| 5,093,699 | * 3/1992 | Weichold et al. | 357/105 |
| 5,390,145 | 2/1995 | Nakasha et al. . | |
| 5,606,177 | 2/1997 | Wallace et al. . | |
| 5,698,997 | 12/1997 | Williamson, III et al. . | |
| 5,869,845 | 2/1999 | Vander Wagt et al. . | |
| 5,936,265 | * 8/1999 | Koga | 257/105 |
| 5,953,249 | 9/1999 | van der Wagt . | |
| 6,150,242 | * 11/2000 | Van der Wagt et al. | 438/481 |
| 6,184,539 | * 2/2001 | Wu et al. | 257/25 |

* cited by examiner

*Primary Examiner*—John F. Niebling
*Assistant Examiner*—Viktor Simkovic
(74) *Attorney, Agent, or Firm*—Amin & Turocy, L.L.P.

(57) ABSTRACT

An SRAM memory cell device is provide having a single transistor and a single RTD latch structure. The single transistor and RTD latch structure are formed on a very thin silicon layer, typically in the range of 250 to 300 Å thick, allowing for increased memory cell density over a given area. The RTD latch structure is a lateral RTD device, such that the outer contacting regions, the tunneling barriers and the central quantum well are formed side-by-side as opposed to being stacked on top of one another. This allows for formation of the memory cell device on very thin silicon layers. The layers can then be stacked to form memory devices for use with computers and the like. The memory device can be formed employing silicon-on-insulator (SOI) technology to take advantage of SOI device characteristics.

26 Claims, 10 Drawing Sheets

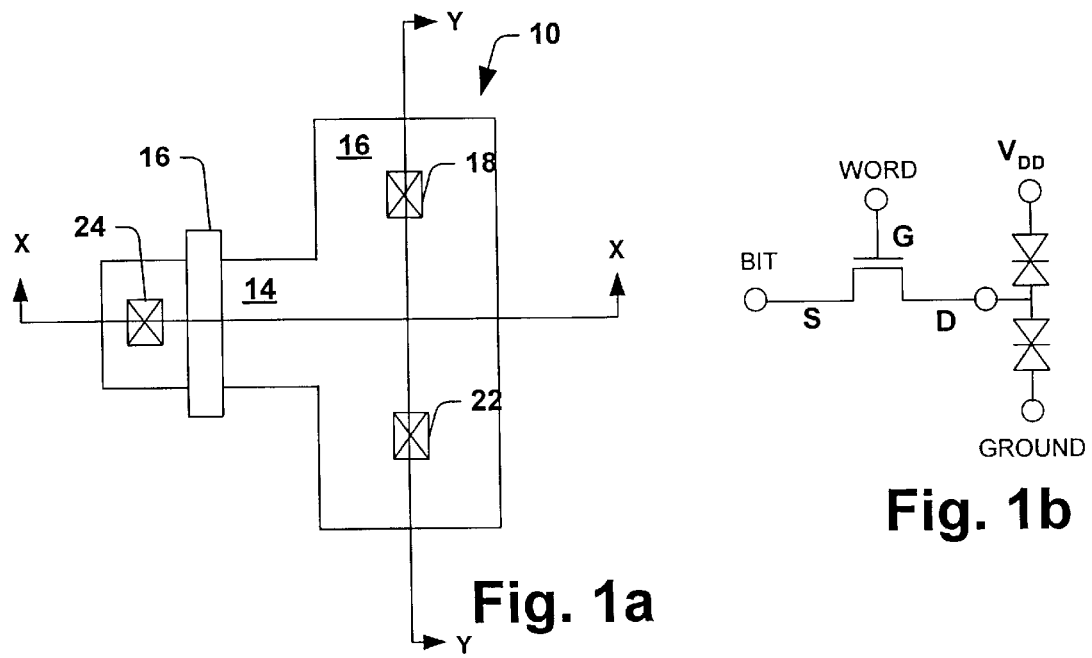
Fig. 1a
Fig. 1b
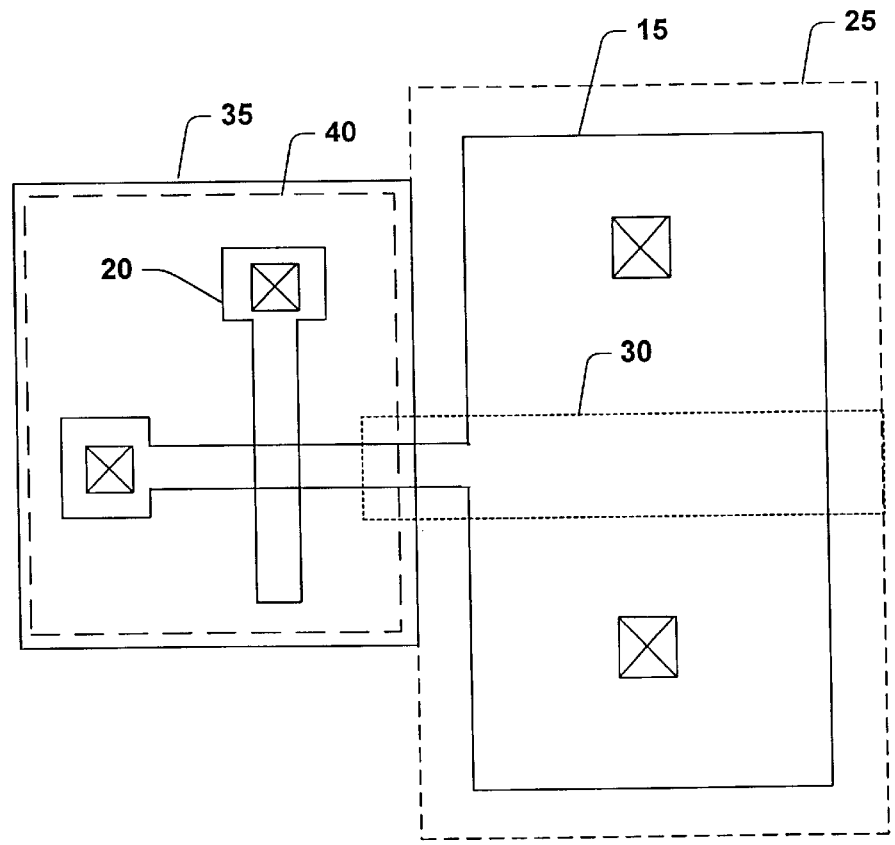
Fig. 1c

SILICON BASED LATERAL TUNNELING MEMORY CELL

FIELD OF THE INVENTION

The present invention generally relates to the design of memory cells and, more particularly, to a memory cell consisting of a metal oxide silicon (MOS) transistor structure and a resonant tunneling diode (RTD) device.

BACKGROUND OF THE INVENTION

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. High density random access memory (RAM) devices have reached the gigabyte level with the introduction of the dynamic RAM (DRAM). The DRAM memory cell can consist of a single pass transistor and a capacitor to obtain the smallest possible cell size. However, DRAM devices require periodic refreshing, typically in the order of once per millisecond, since a bit stored as a charge on a capacitor leaks away at a fairly fast rate. Static RAM (SRAM) devices provide enhanced functionality since no refreshing is need and are also generally faster than a DRAM device. However in general the SRAM device is more complex, requiring either six transistors or four transistors and two load resistors. It is therefore desirable to have memory cells with functional qualities of SRAM devices but with cell sizes closer to the DRAM devices.

A memory cell using a negative differential resistance elements has drawn much attention as a memory structure able to form an SRAM with a more simplified structure. If a load is connected to a differential resistance element, three stable operating points can be obtained. An SRAM cell can be formed by employing two of the three stable operating points. A resonant tunneling diode (RTD) latch typically consists of a sequence of five semiconductor layers. The outer two layers are contact layers and the inner three layers include two narrow tunneling barrier layers and a middle wide layer referred to as a quantum well. Each layer differs in their respective energy bandwidths necessary to tunnel through the RTD and provide current flow. The sequence of layers produces an energy profile through which electrons travel and can include two energy barriers (e.g., the tunneling barriers) separate by a narrow region (e.g., the quantum well). Typically, an electron with energy referred to as the Fermi energy, approaching the first tunneling barrier is reflected. However, as the dimensions of the tunneling barrier decrease toward the wavelength of the electron, the electron begins tunneling through the barrier causing current to flow. Since RTD structures have positive qualities such as high speed, high noise immunity, low power and can be fabricated at high densities, the structure becomes ideally suited for memory devices. However, improvements in fabrication and size are always highly desirable.

In view of the above, it is apparent that there is a need in the art for a method of providing an SRAM memory device that is smaller and consumes less power than conventional SRAM memory devices. It is also apparent that improved methods of fabricating such devices are also needed.

SUMMARY OF THE INVENTION

The present invention provides for an SRAM memory cell device comprised of a single transistor and a single RTD latch structure. The single transistor and RTD latch structure are formed on a very thin silicon layer, typically in the range of 250 to 300 Å thick, allowing for increased memory cell density over a given area. The RTD latch structure is a lateral RTD device, such that the outer contacting regions, the tunneling barriers and the central quantum well are formed side-by-side as opposed to being stacked on top of one another. This allows for formation of the memory cell device on very thin silicon layers. The layers can then be stacked to form memory devices for use with computers and the like. The memory device can be formed employing silicon-on-insulator (SOI) technology to take advantage of SOI device characteristics.

One aspect of the invention relates to a method of forming a memory device. The method comprises the steps of forming a silicon base, an oxide layer over the base and a top thin silicon layer over the oxide layer. The top silicon layer has a first region and a second region. The second region of the top thin silicon layer is masked and a transistor device is formed in the first region of the top thin silicon layer. The first region of the top thin silicon layer is then masked and a lateral RTD device is formed in the second region of the top thin silicon layer.

Another aspect of the invention relates to a method of forming a memory device, comprising the steps of forming a silicon base, an oxide layer over the base and a top thin silicon layer over the oxide layer. The top silicon layer has a first region and a second region. The second region of the top silicon layer is masked and a gate and a P$^-$ body region are formed in the first region. A nitride layer is then formed over the top silicon layer. A region of the nitride layer is masked over a central region of the second region. A first spacer pair is then formed adjacent opposite sides of the gate and a nitride dummy mask are formed over the central region of the second region. N$^+$ source and N$^+$ drain regions are formed in the first region of the top silicon layer. A second spacer pair is formed adjacent opposite sides of the nitride dummy mask in the second region. P$^+$ outer contact regions are formed in the second region of the top silicon layer. A plasma oxide layer is then deposited over the second region of the top silicon layer and the nitride dummy mask is removed from the central region of the second region. A N$^+$ central region or quantum well is formed in the second region of the top silicon layer, such that undoped tunneling barriers remain below each of the second pair of spacers between the central region and the P$^+$ outer contact regions. An oxide layer is then deposited over the top silicon layer and contacts are formed to the gate, the N$^+$ drain region and the P$^+$ outer contact regions.

Yet another aspect of the invention relates to a memory device. The memory device comprises a silicon base, an oxide layer over the base and a top thin silicon layer over the oxide layer. The top silicon layer has a first region and a second region. A transistor structure is disposed in the first region and a laterally displaced RTD structure is disposed in the second region wherein a drain region of the transistor structure is coupled to a central region of the RTD structure.

Another aspect of the invention relates to an SOI NMOS memory device. The memory comprises a silicon substrate, an insulating oxide layer formed over the substrate and a top silicon layer formed over the insulating oxide layer. The top silicon layer has a transistor region and a RTD structure region. A gate is formed over a region of the transistor region and a gate oxide is formed between the gate and the transistor region. N$^+$ source and N$^+$ drain regions are formed in the transistor region. A N$^+$ central region is formed in the RTD structure region coupled to the N$^+$ drain region.

Undoped silicon regions are formed on opposite sides of the N+ central region and P+ outer contact regions are formed on sides of the undoped silicon region opposite the N+ central region.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWING

FIG. 1 a illustrates a top view of a memory structure in accordance with the present invention;

FIG. 1b illustrates a schematic diagram of an equivalent circuit of the memory device of FIG. 1a in accordance with the present invention;

FIG. 1c illustrates a top view of the memory structure and various masks employed during fabrications of the memory structure of FIG. 1a in accordance with the present invention;

DETAILED DESCRIPTION OF THE INVENTION

Figure 2:
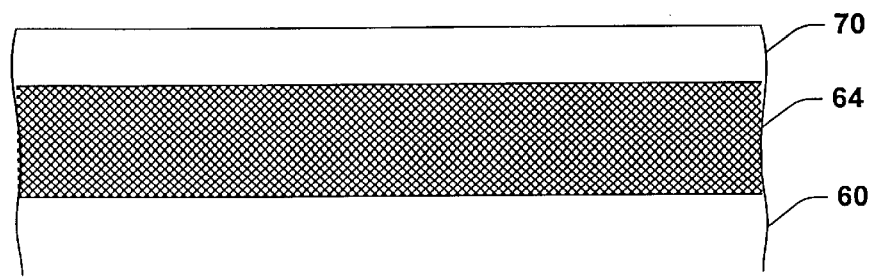
FIG. 2 is a schematic cross-sectional illustration of an SOI substrate in accordance with the present invention.
Figure 3:
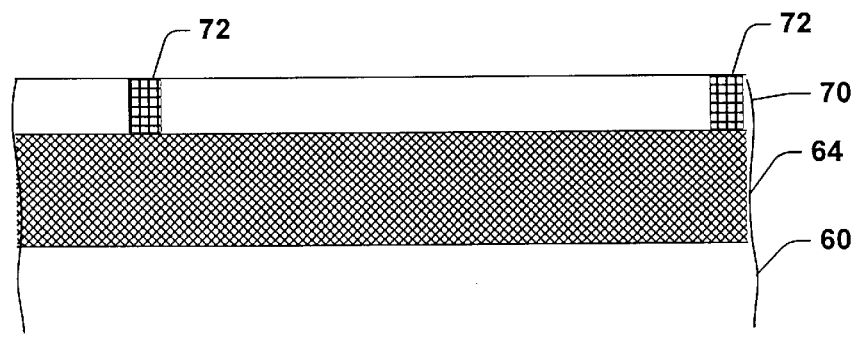
FIG. 3 is a schematic cross-sectional illustration of the structure of FIG. 2 with isolation regions formed therein in accordance with the present invention.

The present invention relates to a memory device structure which utilizes a single transistor and a single resonant tunneling diode (RTD) latch to form a memory cell. The memory device of the present invention exhibits faster performance, lower power consumption and is much smaller than many conventional memory devices. The present invention will now be described with reference to the drawings, wherein like reference numerals are used to refer to like elements throughout. The present invention employs silicon-on-insulator (SOI) technology utilizing a very thin superficial silicon thickness. It should be understood that the description of this preferred embodiment is merely illustrative and that it should not be taken in a limiting sense.

FIG. 1a is a memory device structure 10 including a transistor region 14 and an RTD region 16. A bit contact 24 is provided in the transistor region 14 for coupling a transistor source region to a bit line and a word line 16 is connected to a transistor gate of the same transistor device. A power bit 18 is provided for connecting one end of an RTD latch in the RTD region 16 to a power source and a ground bit 22 is provided for connecting the other end of the RTD latch to a ground. The transistor is coupled to the RTD by a commonly shared doped region (not shown). An equivalent circuit of the memory device structure 10 is illustrated in FIG. 1b. The source of the transistor is coupled to the bit contact 24, the gate is coupled to the word line 16 and the drain is coupled to the central region of the RTD. FIG. 1c illustrates the various masks utilized in the fabrication of memory device structure 10. The masks include an activation or isolation mask 15, a gate mask 20, an n-channel halo mask or laterally doped channel mask 25, an RTD dummy gate mask 30, a $N^+$ source/drain mask 35 and a $P^+$ source/drain mask 40.

Turning now to FIGS. 2–12, fabrication steps in connection with forming the transistor structure in the transistor region 14 of FIG. 1a is discussed. FIG. 2–12 illustrate a X—X cross section of FIG. 1a. FIG. 2 illustrates a basic SOI structure in its early stages of fabrication. The structure includes the silicon base 60, the silicon oxide layer 64 and the top silicon layer 70. This basic structure is formed preferably via a SIMOX (Separation by Implantation of Oxygen) process. The basic steps of the SIMOX process involve implanting oxygen beneath the surface of a silicon wafer. An annealing step is next performed to coalesce the implanted oxygen atoms into a uniform layer of $SiO_2$. Sometimes, epitaxial silicon may be grown atop the silicon to satisfy specific device requirements, but with or without an epitaxial layer, the top surface film 70 becomes the active region for device fabrication. The buried oxide layer 64 is typically 500 to 1000 Å thick and exhibit almost complete incorporation of the implanted oxygen. However, it may be desirable to form the buried oxide layer thinner than 500Å if possible. Typical implant energies range from 150 to 200 keV, while the oxygen dose may vary from 1 to 2E18 $cm^{-2}$. The top silicon film 70 thickness as well as the variation thereof with respect to the oxide layer 64 thickness is a function of the implant energy as well as the rate of surface silicon sputtering during the implant process. Preferably, the top silicon film 70 is very thin and typically in the range of 250 to 300 Å thick.

A second step in the SIMOX process is high temperature annealing. Such annealing is typically performed at temperatures greater than 1250° C. for several hours to coalesce the implanted oxygen and achieve solid state recrystallization of the top (superficial) silicon layer 70 from the surface downward.

Figure 4:
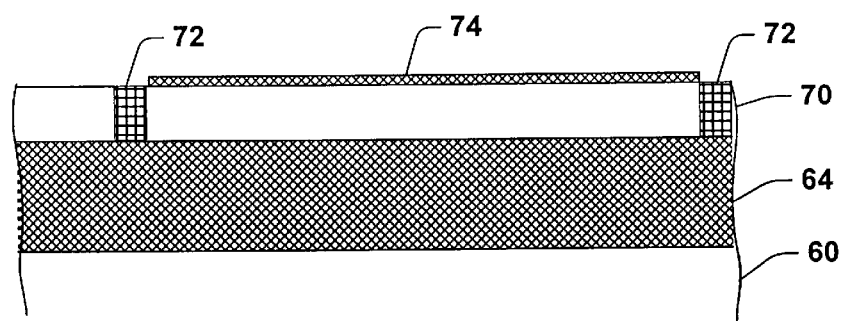
FIG. 4 is a schematic cross-sectional illustration of the SOI substrate of FIG. 3 with a pad oxide layer formed thereon in accordance with the present invention.

Shallow isolation trenches 72 or trench liner oxide in a mesa are formed (FIG. 3) by using the active mask. 15. FIG. 4 illustrates the laying of a thin gate oxide material 74 being laid down on the top silicon layer 70 between the shallow trenches 72. The thin gate oxide material 74 is formed to have a thickness within the range of about <40 Å, preferably between 1–2 nm. Preferably, the thin gate oxide material 74 includes $SiO_2$ which has a substantially low dielectric constant. However, it is to be appreciated that any suitable material (e.g., $Si_3N_4$) for carrying out the present invention may be employed and is intended to fall within the scope of the present invention. The top silicon layer 70 is of a p-type and the trenches 72 serve as isolation barriers to define active regions.

Figure 5:
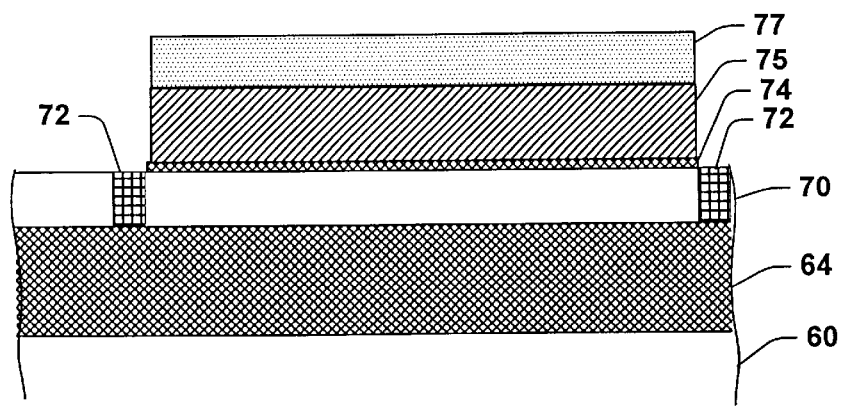
FIG. 5 is a schematic cross-sectional illustration of the structure of FIG. 4 including a polysilicon layer thereon and a silicon oxynitride layer on top of the polysilicon layer in accordance with the present invention.

Thereafter, the gate 78 is formed between the shallow trenches 72 over the thin gate oxide material 74. The gate 78 is formed by depositing a layer of polysilicon 75 having a thickness of about 80–120 nm, as illustrated in FIG. 5. Preferably, the gate material is doped prior to the formation of the gate 78. On top of gate 78 a silicon oxynitride layer 77 is deposited that has a thickness within the range of about 25–75 nm, the thickness is chosen so as to account for any subsequent polishing that might be performed. It will be appreciated of course that the thickness of the thin gate oxide material 74 and the gate 78 may be tailored as desired and the present invention intends to include any suitable range of thicknesses thereof for carrying out the present invention. The gate 78 is the etched utilizing the gate mask 20 and excess gate oxide material 74 is removed as is conventional resulting in the structure illustrated in FIG. 6.

Figure 6:
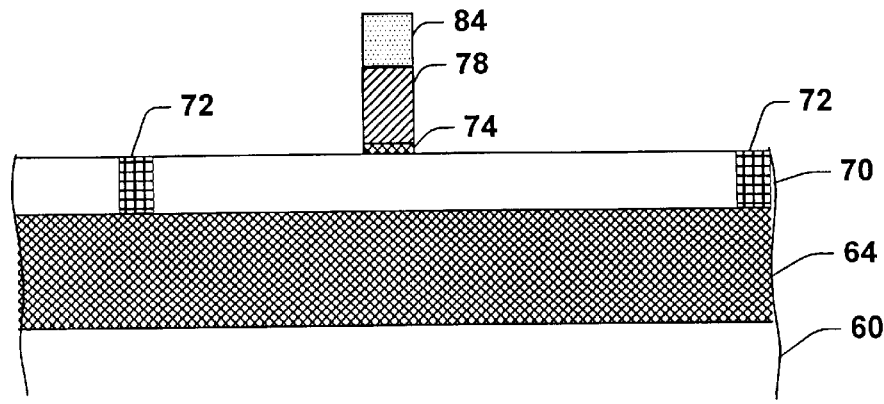
FIG. 6 is a schematic cross-sectional illustration of the structure of FIG. 5 after the polysilicon layer and the silicon oxynitride layer are etched away to form a gate in accordance with the present invention.
Figure 7:
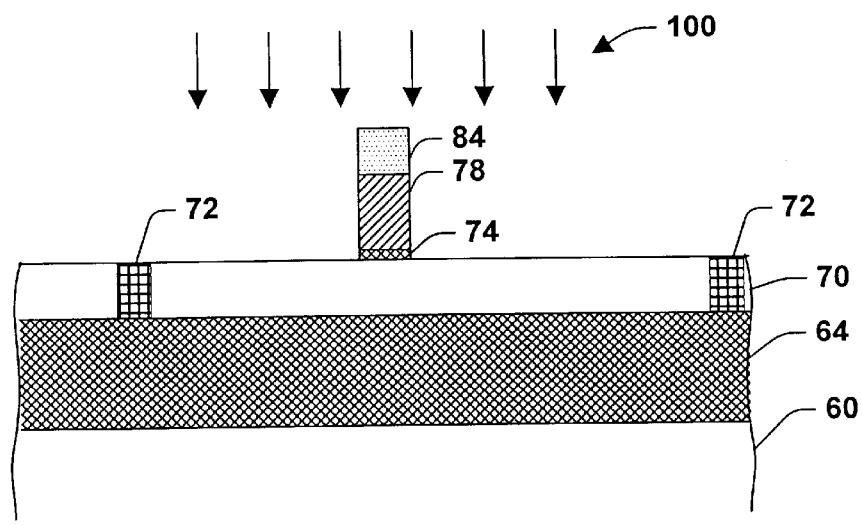
FIG. 7 is a schematic cross-sectional illustration of the structure of FIG. 6 undergoing an ion implant step to form a p-type body region in accordance with the present invention.
Figure 8:
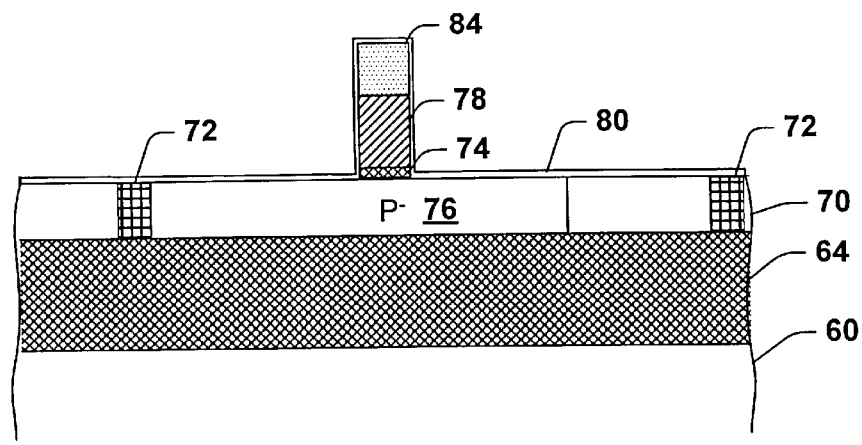
FIG. 8 is a schematic cross-sectional illustration of the structure of FIG. 7 after an oxide liner is deposited over the structure in accordance with the present invention.

FIG. 6 shows the formation of the p-type body 76 by masking a region of the top silicon layer 70 with a laterally doped channel mask 25 and implanting $p^+$ dopants 100 (FIG. 7) to provide the p-type body 76 (FIG. 8). The laterally doped channel mask 25 is utilized to ensure that none of the channel dopant enters the RTD area. The laterally doped channel mask 25 overlaps the RTD area a sufficient distance to avoid any channel dopant from entering the RTD area. In the preferred embodiment, this implant step 100 may be a boron implant having a dose of $2\times10^{13}$ to $3\times10^{13}$ $atoms/cm^2$ and an energy range of about 1 KeV to about 1.5 KeV at 0 degrees tilt.

Figure 9:
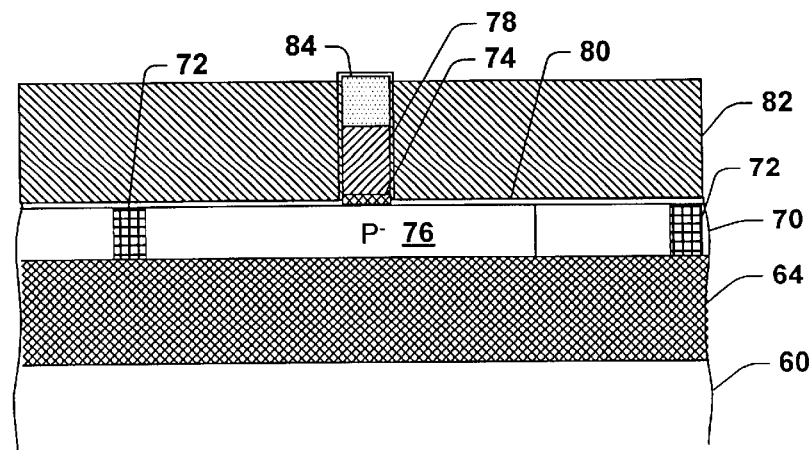
FIG. 9 is a schematic cross-sectional illustration of the structure of FIG. 8 after a nitride layer is deposited over the oxide liner in accordance with the present invention.
Figure 10:
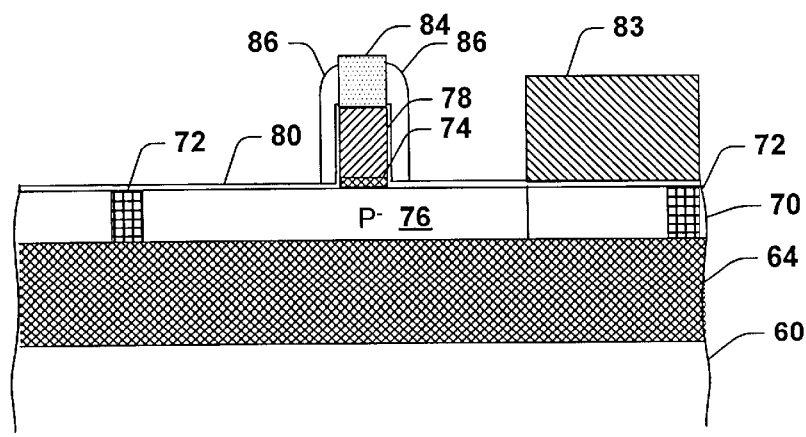
FIG. 10 is a schematic cross-sectional illustration of the structure of FIG. 9 after the nitride layer is etched away to form spacers and a nitride dummy gate in accordance with the present invention.

After the formation of the gate 78, an oxide liner 80 having a thickness of 100 Å is deposited over the structure, as illustrated in FIG. 8. A nitride layer 82 having a thickness of 100 nm thick is then deposited over the oxide liner 80, as illustrated in FIG. 9. An RTD dummy gate mask 30 is utilized to protect a region of the nitride layer 82 to form a nitride dummy gate 83 during formation of spacers. Nitride spacers 86 are formed along sidewalls of the gate 78. The nitride layer 82 is anisotropically etched to form the spacers 86 on the sidewalls of the gate 78, for example. An etchant which selectively etches the spacer material layer (e.g., etches the spacer material layer at a faster rate than the top silicon layer 70), may be used to etch the spacer material layer until only the spacers 86 remain at the sidewalls of the gate 78 as shown in FIG. 10.

Figure 11:
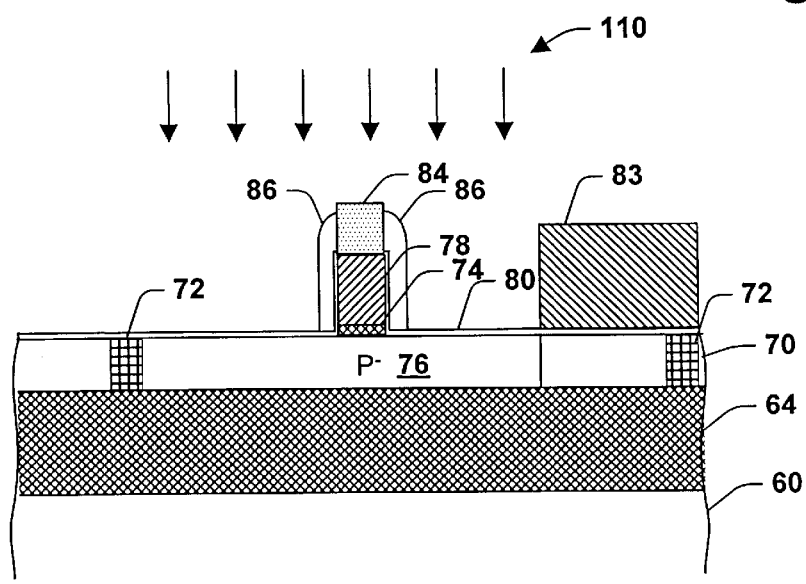
FIG. 11 is a schematic cross-sectional illustration of the structure of FIG. 10 undergoing an ion implant step to form N+ source/drain (S/D) regions in accordance with the present invention.
Figure 12:
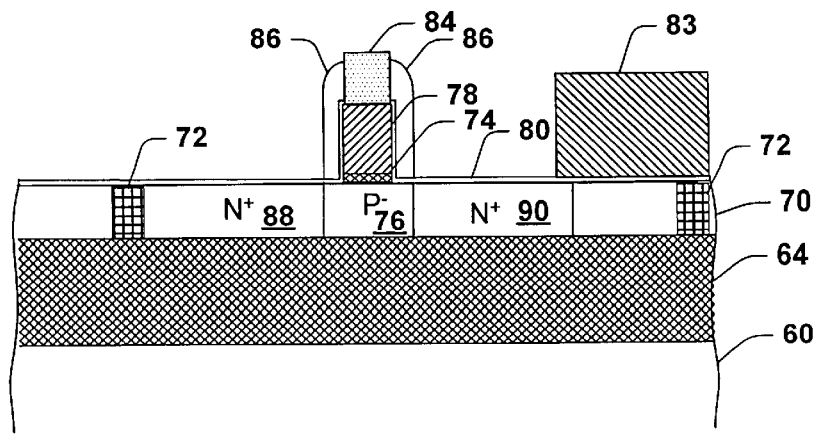
FIG. 12 is a schematic cross-sectional illustration of the structure of FIG. 11 after the ion implant step to form N+ source/drain (S/D) regions in accordance with the present invention.

After the formation of the spacers 86, another ion implant step 110 is performed as shown in FIG. 11. An $N^+$ implant is performed in step 110 to form $N^+$ source region 88 and $N^+$ drain region 90. The spacers 86 serve as masks to prevent ion implantation in the regions of the P-body region 76 underlying the spacers 86. FIG. 11 illustrates the formation of the $N^{30}$ source region 88 and $N^+$ drain region 99 by masking a region of the top silicon layer 70 with a source drain channel mask 35 and implanting $p^{30}$ dopants 110 (FIG. 11) to provide the $N^+$ source region 88 and $N^+$ drain region 90 (FIG. 12). The source drain channel mask 35 protects the entire RTD region. In a preferred aspect of the invention, this implant step 110 may be an arsenic implant having a dose of $2\times10^{15}$ to $3\times10^{15}$ atoms/cm$^2$ and an energy range of about 15 KeV to about 25 KeV. A rapid thermal anneal (RTA) is then performed on the N$^+$ source region 88 and N$^+$ drain region 90 to active the source region 88 and the drain region 90. FIG. 12 illustrates the completed transistor structure in relevant part.

Figure 13:
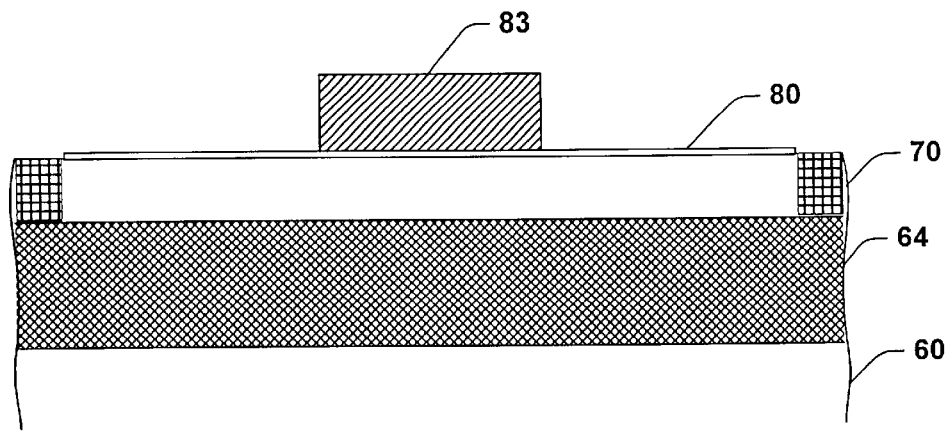
FIG. 13 is a schematic cross-sectional illustration of the structure of FIG. 17 illustrating the RTD structure along the lines Y—Y in accordance with the present invention.
Figure 14:
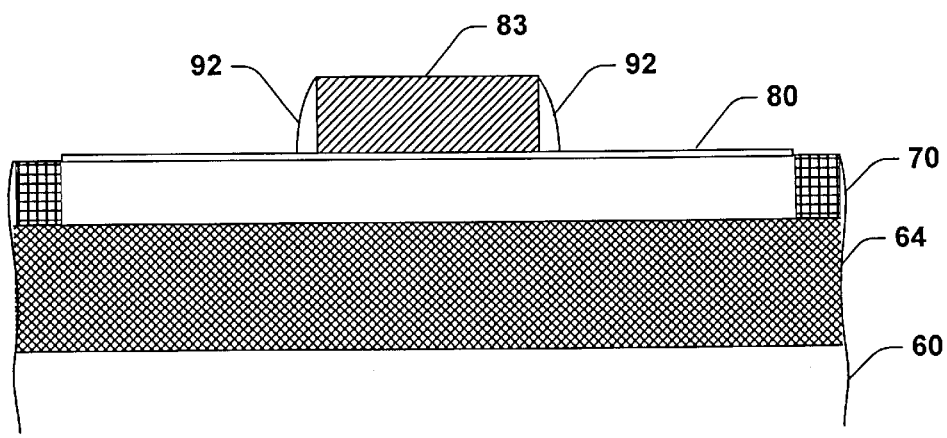
FIG. 14 is a schematic cross-sectional illustration of the structure of FIG. 13 after the formation of spacers on the sides of the nitride dummy gate in accordance with the present invention.

Turning now to FIGS. 13–25, fabrication steps in connection with forming the RTD structure in the RTD region 16 of FIG. 1a is discussed. Turning now to FIG. 13, a Y—Y cross section through a central region of the RTD area is illustrated. Spacers 92 are formed along sidewalls of the nitride dummy gate 83. To accomplish this step, a spacer material layer (not shown) may be formed over the top silicon layer 70. The spacer material layer may be formed by depositing silicon dioxide or the like over the surface of the top silicon layer 70. The spacer material is then anisotropically etched to form the spacers 92 on the sidewalls of the nitride dummy gate 83, for example. An etchant which selectively etches the spacer material layer (e.g., etches the spacer material layer at a faster rate than the top silicon layer 70 and the nitride dummy gate 83), may be used to etch the spacer material layer until only the spacers 92 remain at the sidewalls of the nitride dummy gate 83 as shown in FIG. 14. Preferably, the oxide spacers have a width of 100–200 Å.

Figure 15:
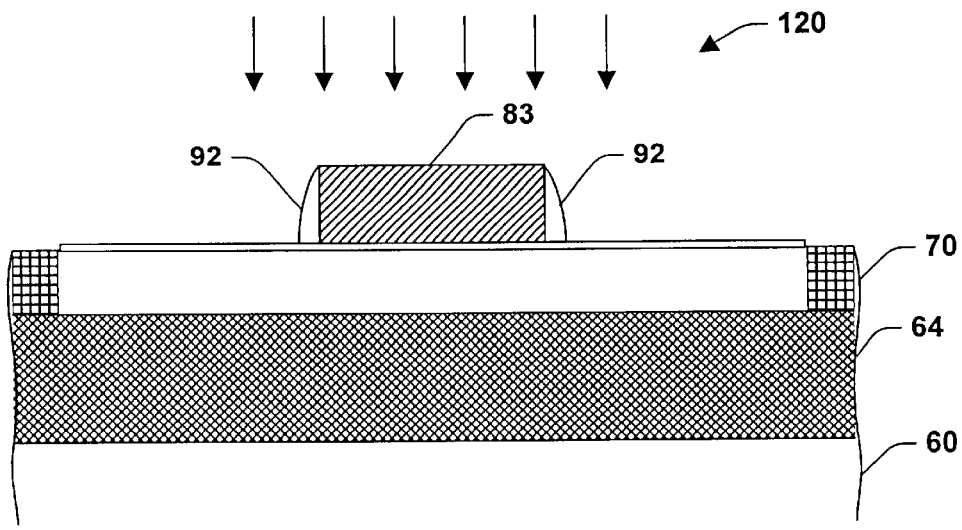
FIG. 15 is a schematic cross-sectional illustration of the structure of FIG. 14 undergoing an ion implant step to form P+ RTD outer contacting regions in accordance with the present invention.
Figure 16:
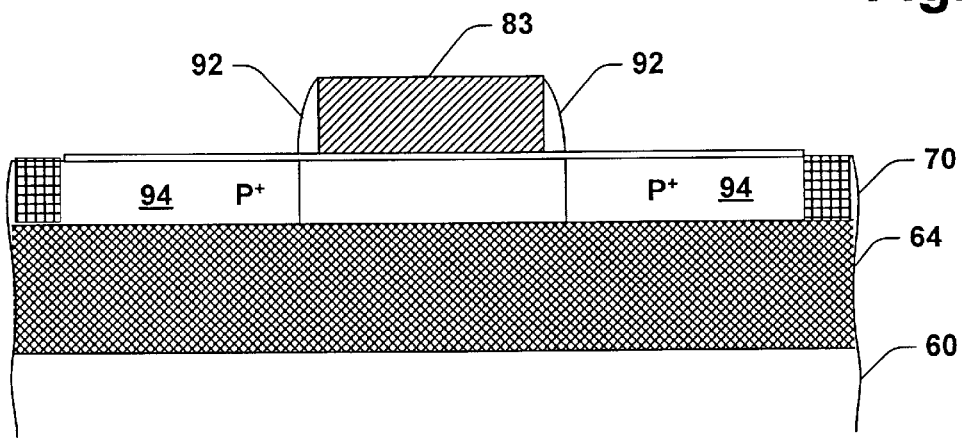
FIG. 16 is a schematic cross-sectional illustration of the structure of FIG. 15 after the ion implant step to form P+ RTD outer contacting regions in accordance with the present invention.
Figure 17:
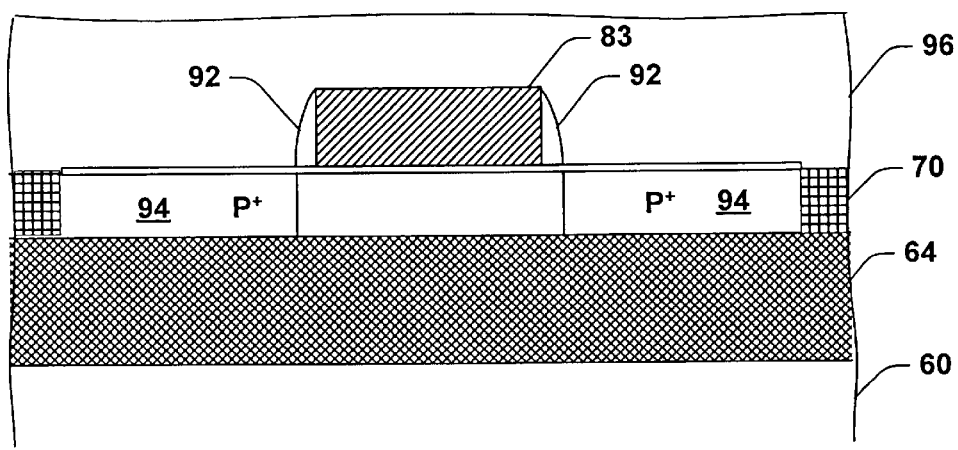
FIG. 17 is a schematic cross-sectional illustration of the structure of FIG. 16 after a plasma oxide layer is deposited over the RTD structure in accordance with the present invention.
Figure 18:
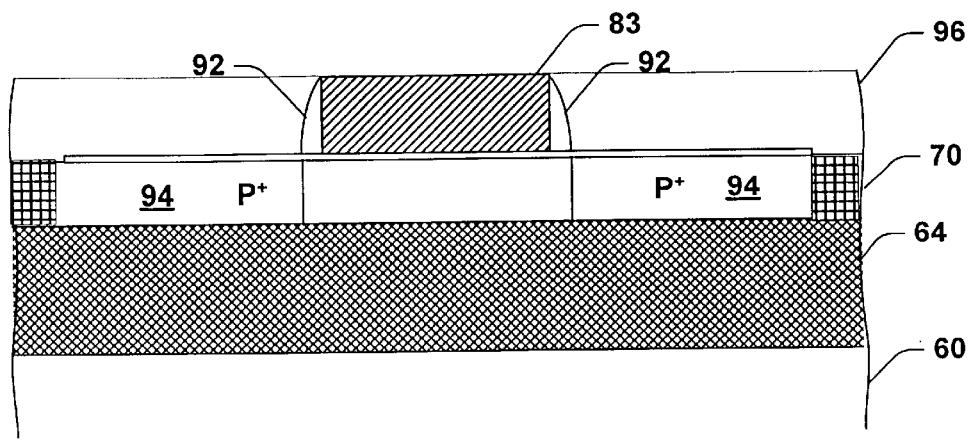
FIG. 18 is a schematic cross-sectional illustration of the structure of FIG. 17 after the plasma oxide layer is polished to the nitride dummy gate in accordance with the present invention.
Figure 19:
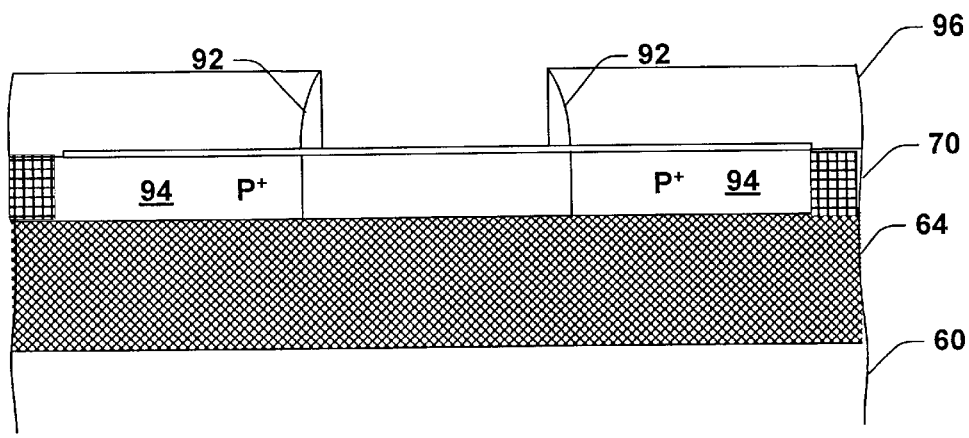
FIG. 19 is a schematic cross-sectional illustration of the structure of FIG. 18 after the nitride dummy gate is removed in accordance with the present invention.

FIG. 15 shows the formation of the p-type regions 94 by masking a region of the top silicon layer 70 with a P$^{30}$ mask 40 and implanting P$^+$ dopants 120 to provide the pocket type regions 94 (FIG. 16). The P$^+$ mask 40 is utilized to ensure that none of the channel dopant enters the transistor area. The nitride dummy gate 83 and the spacers 92 keep the P$^+$ dopants 120 from entering the central region of the RTD area. Prior to doping with the P$^+$ dopants 120, the silicon layer 70 is amorphorized by a germanium implant (not shown) having a dose of $5\times10^{13}$ to $2\times10^{14}$ atoms/cm$^2$ and an energy range of about 20 KeV to about 30 KeV. In a preferred aspect of the invention, the implant step 120 may be a boron implant having a dose of $2\times10^{15}$ to $3\times10^{15}$ atoms/cm$^2$ and an energy range of about 1 KeV to about 3.0 KeV. A layer of plasma oxide is deposited in FIG. 17 and polished down to the nitride dummy gate 83, as illustrated in FIG. 18. The nitride dummy gate 83 is then removed by dipping the structure in phosphoric acid resulting in the structure illustrated in FIG. 19.

Figure 20:
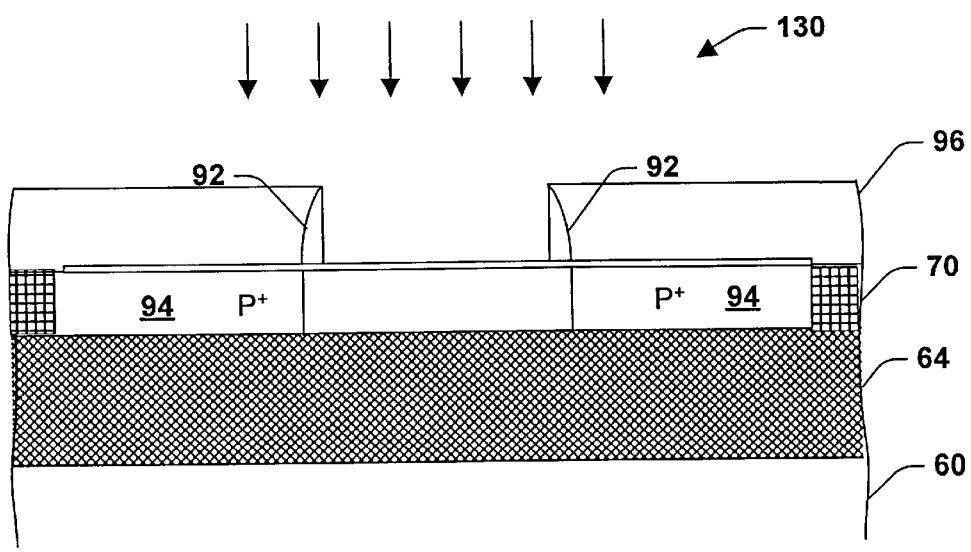
FIG. 20 is a schematic cross-sectional illustration of the structure of FIG. 19 undergoing an ion implant step to form N+ RTD quantum well region in accordance with the present invention.
Figure 21:
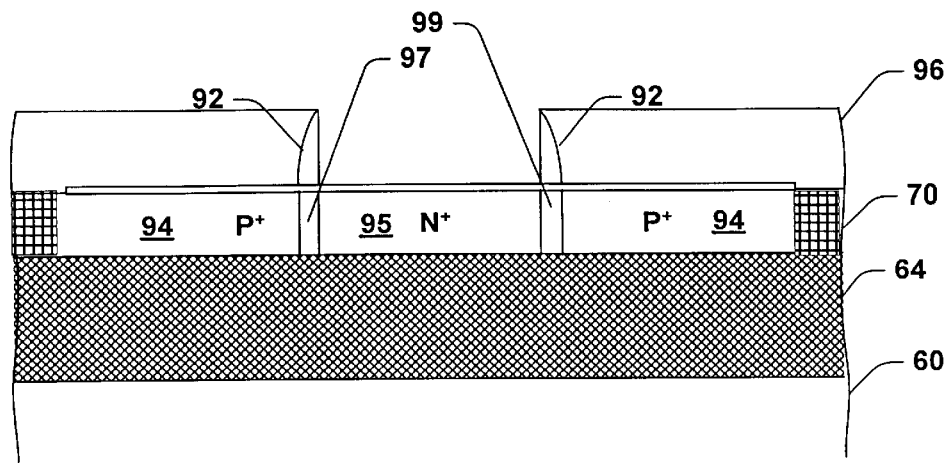
FIG. 21 is a schematic cross-sectional illustration of the structure of FIG. 20 after the ion implant step to form N+ RTD quantum well region in accordance with the present invention.

FIG. 20 shows the formation of the n-type central region or quantum well region 95 by implanting N$^+$ dopants 130 to provide the n-type region 95 (FIG. 21). The plasma oxide layer provides a mask for the entire area, except where the nitride dummy gate 83 was removed and where the spacers 92 reside. Prior to doping with the N$^+$ dopants 130, the silicon layer 70 is amorphorized by a germanium implant (not shown) having a dose of $5\times10^{13}$ to $2\times10^{14}$ atoms/cm$^2$ and an energy range of about 20 KeV to about 30 KeV. In a preferred aspect of the invention, this implant step 130 may be an arsenic or phosphorous implant having a dose of $2\times10^{15}$ to $3\times10^{15}$ atoms/cm$^2$ and an energy range of about 1 KeV to about 3.0 KeV. The regions below the spacers 92 are undoped regions and form tunneling barrier regions 97 and 99 as illustrated in FIG. 21. Both the RTD p-type regions 96 and n-type region 95 are activated by laser annealing. A layer of isolation material 98 is deposited and planarized in FIG. 22. The isolation layer 98 preferably has a thickness of 500–600 nm.

An etch step (e.g., anisotropic reactive ion etching (RIE)) is performed to form a first via 102 and a second via 104 (FIG. 23) in the isolation layer 98. A patterned photoresist (not shown) may be used as a mask for selectively etching the isolation layer 98. Any suitable etch technique may be used to etch the isolation layer 98. For example, the isolation layer 98 can be anisotropically etched with a plasma gas(es), herein carbon tetrafloride (CF$_4$) containing fluorine ions, in a commercially available etcher, such as a parallel plate RIE apparatus or, alternatively, an electron cyclotron resonance (ECR) plasma reactor to replicate the mask pattern of the patterned photoresist layer to thereby create the first via 102 and the second via 104 in the isolation layer 98.

Figure 24:
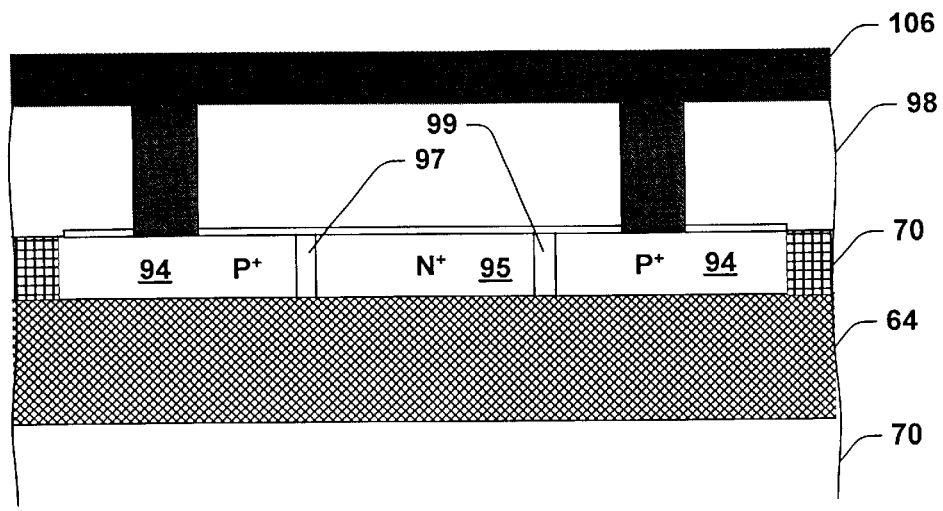
FIG. 24 is a schematic cross-sectional illustration of the structure of FIG. 23 after a metal layer is deposited over the structure in accordance with the present invention.
Figure 25:
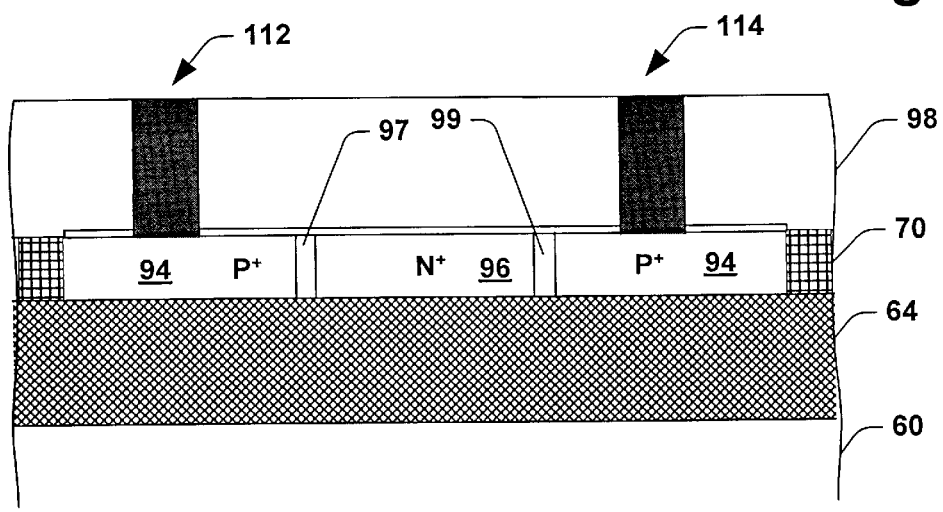
FIG. 25 is a schematic cross-sectional illustration of the structure of FIG. 24 after the metal layer has been polished back in accordance with the present invention

Thereafter, as illustrated in FIG. 24, the first and second vias are filled with a Ta liner and electropolished copper 106 so as to form a first conductive contact and a second conductive contact. FIG. 25 illustrates the RTD structure after a polished back step has been performed to remove a predetermined thickness of the metal layer 106. Preferably, the polished back step is performed to remove an amount of the metal, equivalent to the thickness of the metal layer 106 overlying the insolation layer 98. Substantial completion of the polished back step results in a RTD structure in relevant part as illustrated in FIG. 25. The RTD structure includes a contact 112 for connecting one end of the RTD structure to VDD and a second contact 114 for connecting the other end of the RTD structure to ground.

Figure 22:
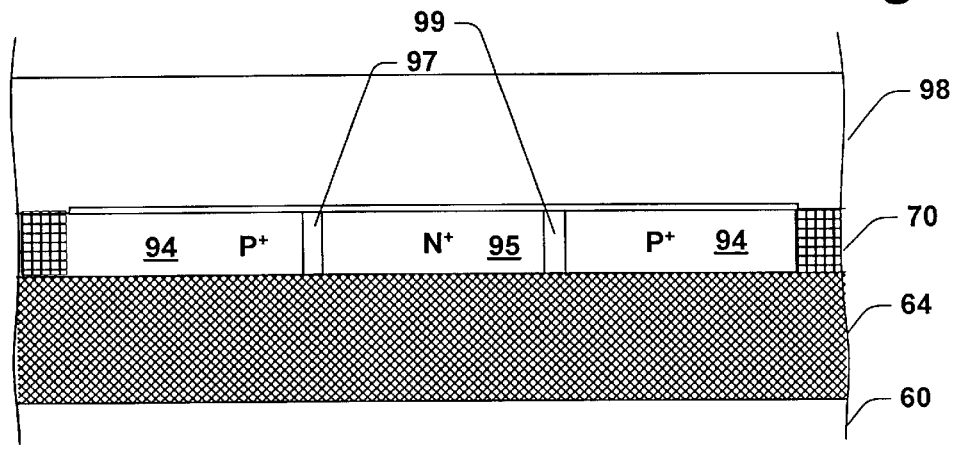
FIG. 22 is a schematic cross-sectional illustration of the structure of FIG. 21 after an isolation layer is deposited over the RTD structure in accordance with the present invention.
Figure 23:
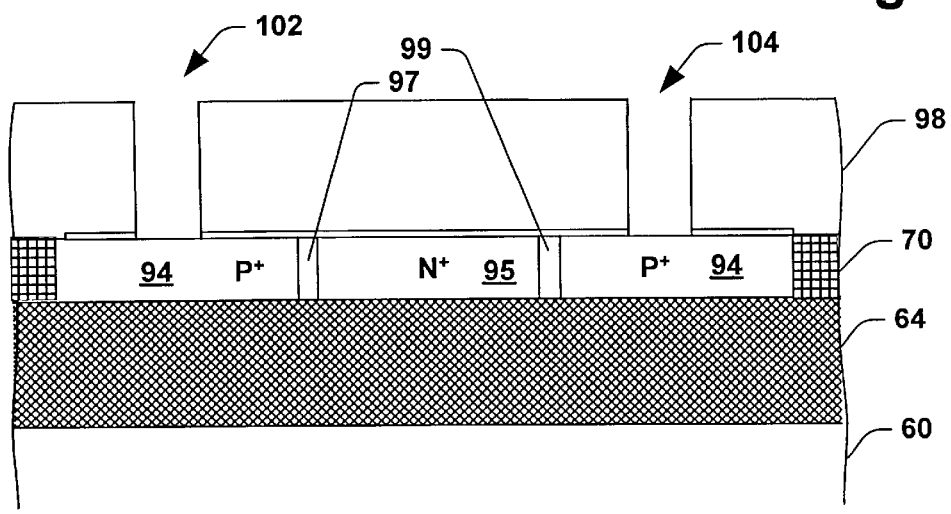
FIG. 23 is a schematic cross-sectional illustration of the structure of FIG. 22 after an etching step to form openings in the isolation layer in accordance with the present invention.
Figure 26:
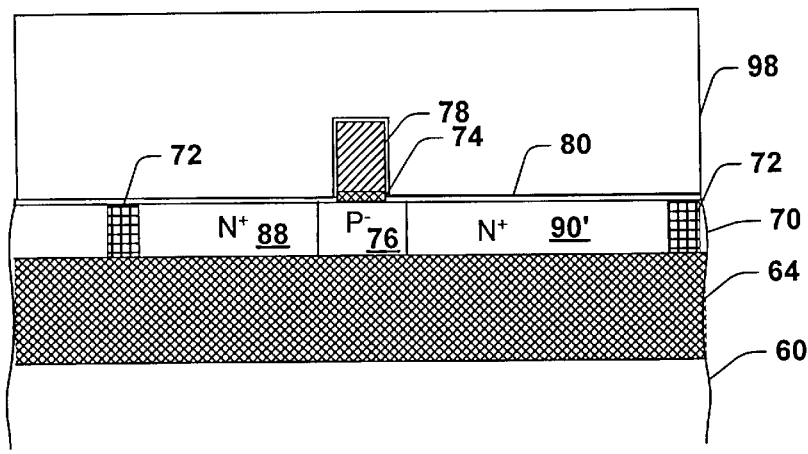
FIG. 26 is a schematic cross-sectional illustration of the structure of FIG. 12 undergoing and etching step to form openings in the transistor region in accordance with the present invention.
Figure 27:
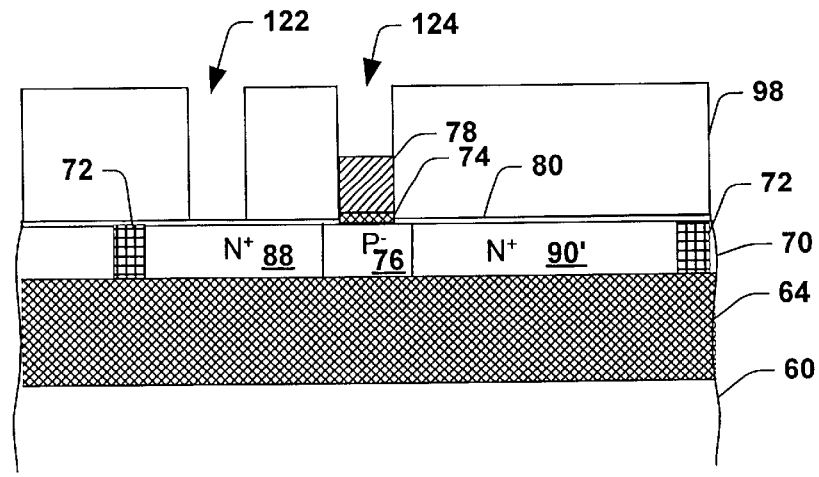
FIG. 27 is a schematic cross-sectional illustration of the structure of FIG. 26 after the etching step to form openings in the transistor region in accordance with the present invention.

FIG. 26 illustrates the state of the transistor structure after the steps up to FIG. 22 have been performed on the RTD structure. Trenches are formed for connecting the transistor structure to a word line and a bit line. An etch step (e.g., anisotropic reactive ion etching (RIE)) is performed to form a first trench 122 and a second trench 124 (FIG. 27) in the isolation layer 98. A patterned photoresist (not shown) may be used as a mask for selectively etching the isolation layer 98. Any suitable etch technique may be used to etch the isolation layer 98. For example, the isolation layer 98 can be anisotropically etched with a plasma gas(es), herein carbon tetrafloride (CF$_4$) containing fluorine ions, in a commercially available etcher, such as a parallel plate RIE apparatus or, alternatively, an electron cyclotron resonance (ECR) plasma reactor to replicate the mask pattern of the patterned photoresist layer to thereby create the first trench 122 and the second trench 124 in the isolation layer 98.

Figure 28:
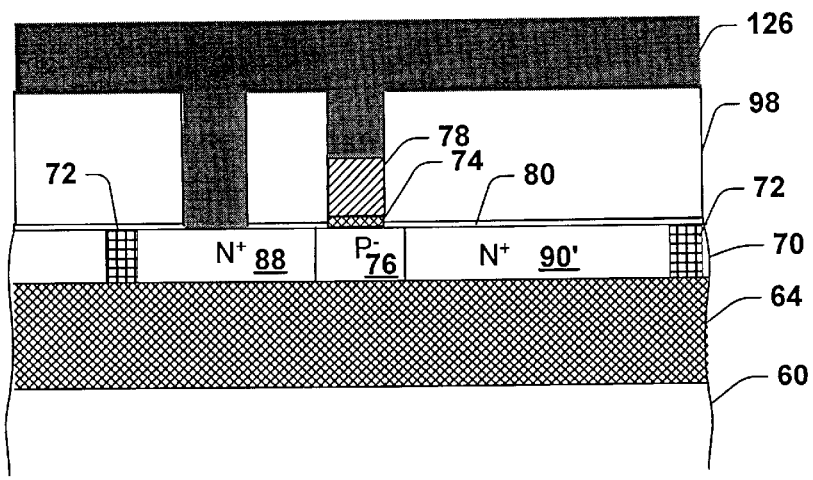
FIG. 28 is a schematic cross-sectional illustration of the structure of FIG. 27 after a metal layer is deposited over the structure in accordance with the present invention.
Figure 29:
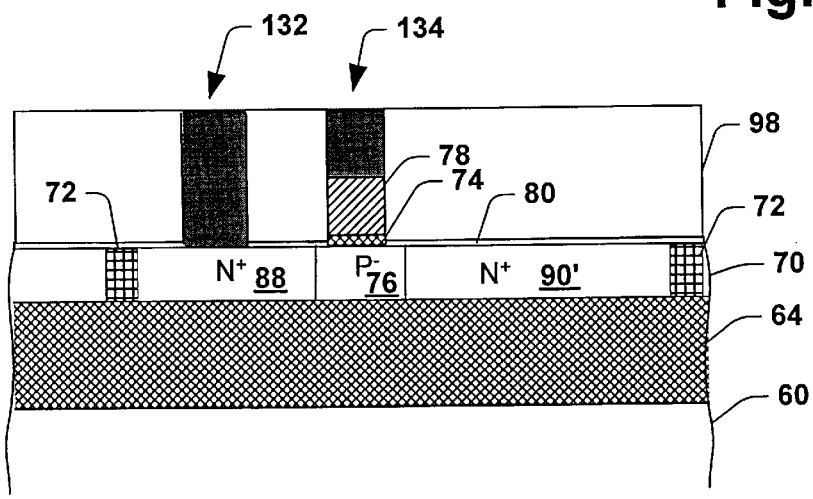
FIG. 29 is a schematic cross-sectional illustration of the structure of FIG. 28 after the metal layer has been polished back in accordance with the present invention

Thereafter, as illustrated in FIG. 28, the first and second trenches are filled with a Ta liner and an electropolished copper layer 126, so as to form a first conductive line and a second conductive line. FIG. 29 illustrates the transistor structure after a polished back step has been performed to remove a predetermined thickness of the metal layer 126. Preferably, the polished back step is performed to remove an amount of the metal, equivalent to the thickness of the metal layer 126 overlying the insolation layer 98. Substantial completion of the polished back step results in a transistor structure in relevant part as illustrated in FIG. 29. The transistor structure includes a conducting line 132 for connecting the source of the transistor structure to a bit line and a second conducting line 134 for connecting the gate of the transistor structure to a word line.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming a memory device, comprising the steps of:
   forming a silicon base, an oxide layer over the base and a top thin silicon layer over the oxide layer, the top silicon layer having a first region and a second region;
   masking the second region of the top thin silicon layer and forming a transistor device in the first region of the top silicon layer;
   masking the first region of the top thin silicon layer and forming a lateral RTD device in the second region.

2. The method of claim 1, the lateral RTD device including a central $N^+$ region coupled to a drain of the transistor device.

3. The method of claim 2, the lateral RTD device including a thin tunneling barrier formed from undoped silicon adjacent opposite sides of the central $N^+$ region.

4. The method of claim 3, the lateral RTD device including outer contacting $P^+$ regions adjacent sides of the tunneling barrier opposite the central $N^+$ region.

5. The method of claim 1, the top silicon layer having a thickness between 250–300 Å.

6. The method of claim 5, the oxide layer having a thickness between 500–1000 Å.

7. The method of claim 1, the step of forming a transistor comprising forming a gate, implanting $p^+$ dopants in the first region to provide a p-type body, forming a first pair of spacers adjacent the gate and implanting $n^+$ dopant to form source and drain regions of the transistor device.

8. The method of claim 7, the step of forming the gate comprising laying a thin gate oxide material over the first region, depositing a polysilicon layer having a thickness of about 80–120 nm over the thin gate oxide material, depositing a silicon oxynitride layer having a thickness within the range of 25–75 nm over the polysilicon layer and etching a gate using a gate mask.

9. The method of claim 7, the step of implanting $p^+$ dopants in the first region to provide a p-type body comprising using boron having a dose of about $2\times10^{13}$ to $3\times10^{13}$ atoms/cm$^2$ and an energy range of about 1 KeV to about 1.5 KeV.

10. The method of claim 7, the step implanting $n^+$ dopant to form source and drain regions of the transistor device comprising using arsenic having a dose of about $2\times10^{15}$ to $3\times10^{15}$ atoms/cm$^2$ and an energy range of about 15 KeV to about 25 KeV.

11. The method of claim 7, the step of implanting $p^+$ dopants in the first region to provide a p-type body comprising using boron having a dose of about $2\times10^{13}$ to $3\times10^{13}$ atoms/cm$^2$ and an energy range of about 1 KeV to about 1.5 KeV.

12. The method of claim 7, the step of forming a first pair of spacers adjacent the gate comprising depositing a nitride layer over both the first and second regions of the thin silicon layer, masking the second region of the thin silicon layer and etching the first region to form the first pair of spacers and a nitride dummy gate over the central region of the second region.

13. The method of claim 12, further including the step of forming a second pair of spacers adjacent the nitride dummy gate and implanting a $P^+$ dopant to form RTD outer contacting regions and RTD tunneling barriers below the second pair of spacers adjacent the outer contacting regions and the central region, the nitride dummy gate and second pair of spacers preventing the $p^+$ dopant from entering the central region of the second region.

14. The method of claim 13, further including the steps of depositing a plasma oxide layer over the second region of the top silicon layer and polishing the plasma oxide layer level with the nitride dummy gate, removing the nitride dummy gate over the central region of the second region and implanting $n^+$ dopant in the central region of the second region.

15. The method of claim 14, the step of implanting $n^+$ dopants in the central region of the second region comprising using one of arsenic and phosphourous having a dose of about $2\times10^{13}$ to $3\times10^{33}$ atoms/cm$^2$ and an energy range of about 1 KeV to about 3.0 KeV.

16. The method of claim 13, each of the second pair of spacers having a width of about 100–200 Å.

17. The method of claim 13, the step of implanting $p^+$ dopants to form RTD outer contacting regions comprising using boron having a dose of about $2\times10^{13}$ to $3\times10^{13}$ atoms/cm$^2$ and an energy range of about 1 KeV to about 3.0 KeV.

18. A method of forming a memory device, comprising the steps of:
   forming a silicon base, an oxide layer over the base and a top thin silicon layer over the oxide layer, the top silicon layer having a first region and a second region;
   masking the second region of the top silicon layer and forming a gate and a $P^{30}$ body region;
   forming a nitride layer over the top silicon layer;
   masking a region of the nitride layer over a central region of the second region;
   forming a first spacer pair adjacent opposite sides of the gate and a nitride dummy mask over the central region of the second region;
   forming $N^+$ source and $N^+$ drain regions in the first region of the top silicon layer;
   forming a second spacer pair adjacent opposite sides of the nitride dummy mask in the second region;
   forming $P^+$ outer contact regions in the second region of the top silicon layer;
   depositing a plasma oxide layer over the second region of the top silicon layer;
   removing the nitride dummy mask from the central region of the second region;
   forming a $N^+$ central region in the second region of the top silicon layer, such that undoped tunneling barriers remain below each of the second pair of spacers between the central region and the $P^+$ outer contact regions;
   depositing an oxide layer over the top silicon layer; and
   forming contacts to the gate, the $N^+$ drain region and the $P^+$ outer contact regions.

19. The method of claim 18, the central $N^+$ region being coupled to the $N^+$ drain region.

20. The method of claim 18, the top silicon layer having a thickness between 250–300 Å.

21. The method of claim 18, the oxide layer having a thickness between 500–1000 Å.

22. The method of claim 18, the step of forming a $N^+$ central region in the second region of the top silicon layer step comprising implanting $n^+$ dopants using one of arsenic and phosphourous having a dose of about $2\times10^{13}$ to $3\times10^{13}$ atoms/cm$^2$ and an energy range of about 1 KeV to about 3.0 KeV.

23. The method of claim 18, each of the second pair of spacers having a width of about 100–200 Å.

24. The method of claim 18, the step of forming P$^+$ outer contacting regions in the second region of the top silicon layer comprising implanting p$^+$ dopants using boron having a dose of about $2 \times 10^{13}$ to $3 \times 10^{13}$ atoms/cm$^2$ and an energy range of about 1 KeV to about 3.0 KeV.

25. The method of claim 18, the step of performing a rapid thermal anneal on the N$^+$ source and N$^+$ drain regions.

26. The method of claim 18, the step of performing a rapid thermal anneal on the N$^+$ central region and the P$^+$ outer contacting regions.

* * * * *

UNITED STATES PATENT AND TRADEMARK OFFICE
CERTIFICATE OF CORRECTION

PATENT NO.     : 6,294,412 B1
DATED          : September 25, 2001
INVENTOR(S)    : Zoran Krivokapic It is certified that error appears in the above-identified patent and that said Letters Patent is hereby corrected as shown below:

Column 6,
Line 61, please replace "$N^{30}$" with -- $N^+$ --.
Line 63, please replace "$p^{30}$" with -- $p^+$ --.

Column 7,
Line 26, please replace "$p^{30}$" with -- $p^+$ --.

Claim 15,
Line 10, please replace "$3 \times 10^{33}$" with -- $3 \times 10^{13}$ --

Claim 18,
Line 27, please replace "$P^{30}$" with -- $P^+$ --

Signed and Sealed this

Sixteenth Day of April, 2002

Attest:

JAMES E. ROGAN
Attesting Officer   Director of the United States Patent and Trademark Office